United States Patent
Hariharan et al.

(10) Patent No.: US 10,276,236 B2
(45) Date of Patent: Apr. 30, 2019

(54) RESISTIVE RANDOM ACCESS MEMORY (RRAM) CELL FILAMENT FORMATION USING CURRENT WAVEFORMS

(71) Applicants: Silicon Storage Technology, Inc., San Jose, CA (US); Agency For Science, Technology, and Research, Connexis (SG)

(72) Inventors: Santosh Hariharan, San Jose, CA (US); Hieu Van Tran, San Jose, CA (US); Feng Zhou, Fremont, CA (US); Xian Liu, Sunnyvale, CA (US); Steven Lemke, Boulder Creek, CA (US); Nhan Do, Saratoga, CA (US); Zhixian Chen, Fusionopolis Way (SG); Xinpeng Wang, Teban Gardens Road (SG)

(73) Assignees: Silicon Storage Technology, Inc., San Jose, CA (US); Agency For Science, Technology, And Research, Connexis (SG)

( * ) Notice: Subject to any disclaimer, the term of this patent is extended or adjusted under 35 U.S.C. 154(b) by 0 days.

(21) Appl. No.: 15/597,709

(22) Filed: May 17, 2017

(65) Prior Publication Data
US 2018/0033482 A1    Feb. 1, 2018

(30) Foreign Application Priority Data
Jul. 26, 2016    (SG) ............... 10201606137Y

(51) Int. Cl.
*G11C 13/00* (2006.01)
*G11C 11/00* (2006.01)
*H01L 27/24* (2006.01)
*H01L 45/00* (2006.01)

(52) U.S. Cl.
CPC .......... *G11C 13/0011* (2013.01); *G11C 11/00* (2013.01); *G11C 13/0007* (2013.01); *G11C 13/0064* (2013.01); *G11C 13/0069* (2013.01); *H01L 27/2436* (2013.01); *H01L 27/2463* (2013.01); *H01L 45/04* (2013.01); *H01L 45/085* (2013.01); *H01L 45/146* (2013.01); *G11C 2013/0066* (2013.01); *G11C 2013/0078* (2013.01); *G11C 2013/0083* (2013.01); *G11C 2013/0088* (2013.01); *G11C 2013/0092* (2013.01); *G11C 2213/79* (2013.01)

(58) Field of Classification Search
CPC ............ G11C 13/0011; H01L 27/2463; H01L 45/085; H01L 27/2436
See application file for complete search history.

(56) References Cited

U.S. PATENT DOCUMENTS

| | | | |
|---|---|---|---|
| 7,372,725 B2 | 5/2008 | Philipp | |
| 8,976,568 B1 * | 3/2015 | Jameson, III | G11C 13/0007 365/148 |
| 9,171,617 B1 | 10/2015 | Park | |

(Continued)

*Primary Examiner* — Ajay Ojha
(74) *Attorney, Agent, or Firm* — DLA Piper LLP (US)

(57) ABSTRACT

A memory device includes a metal oxide material disposed between and in electrical contact with first and second conductive electrodes, and an electrical current source configured to apply one or more electrical current pulses through the metal oxide material. For each of the one or more electrical current pulses, an amplitude of the electrical current increases over time during the electrical current pulse to form a conductive filament in metal oxide material.

22 Claims, 19 Drawing Sheets

(56) References Cited

U.S. PATENT DOCUMENTS

| | | |
|---|---|---|
| 2006/0220071 A1 | 10/2006 | Kang et al. |
| 2008/0151601 A1 | 6/2008 | Kang et al. |
| 2008/0219040 A1 | 9/2008 | Philipp et al. |
| 2009/0195300 A1* | 8/2009 | Schimmel .............. B82Y 10/00 327/537 |
| 2012/0166169 A1 | 6/2012 | Lu |
| 2012/0211719 A1* | 8/2012 | Haimoto ............... H01L 45/085 257/4 |
| 2013/0107605 A1 | 5/2013 | Chen |
| 2013/0187116 A1 | 7/2013 | Tan et al. |
| 2013/0235651 A1 | 9/2013 | Perner et al. |
| 2013/0301337 A1* | 11/2013 | Kamalanathan ... G11C 13/0002 365/148 |
| 2014/0293678 A1* | 10/2014 | Orlowski ................ H01L 45/08 365/148 |
| 2015/0188043 A1 | 7/2015 | Wang et al. |
| 2015/0364192 A1* | 12/2015 | Yoshimoto ......... G11C 13/0069 365/148 |
| 2016/0027510 A1 | 1/2016 | Lee |
| 2016/0042788 A1 | 2/2016 | Ahn et al. |
| 2016/0118131 A1 | 4/2016 | Dong et al. |
| 2016/0155502 A1* | 6/2016 | Goux ................. G11C 13/0069 365/148 |

* cited by examiner

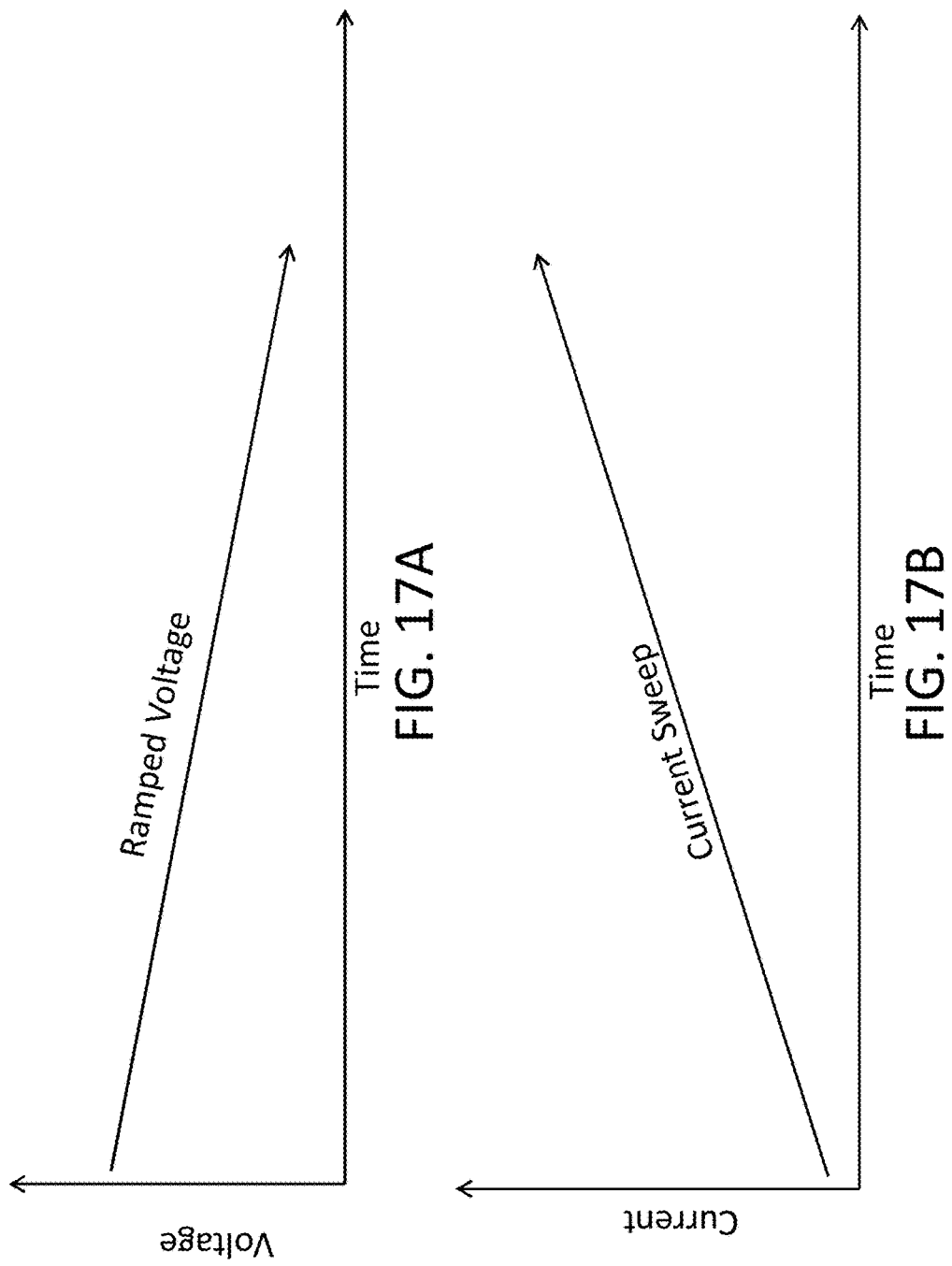

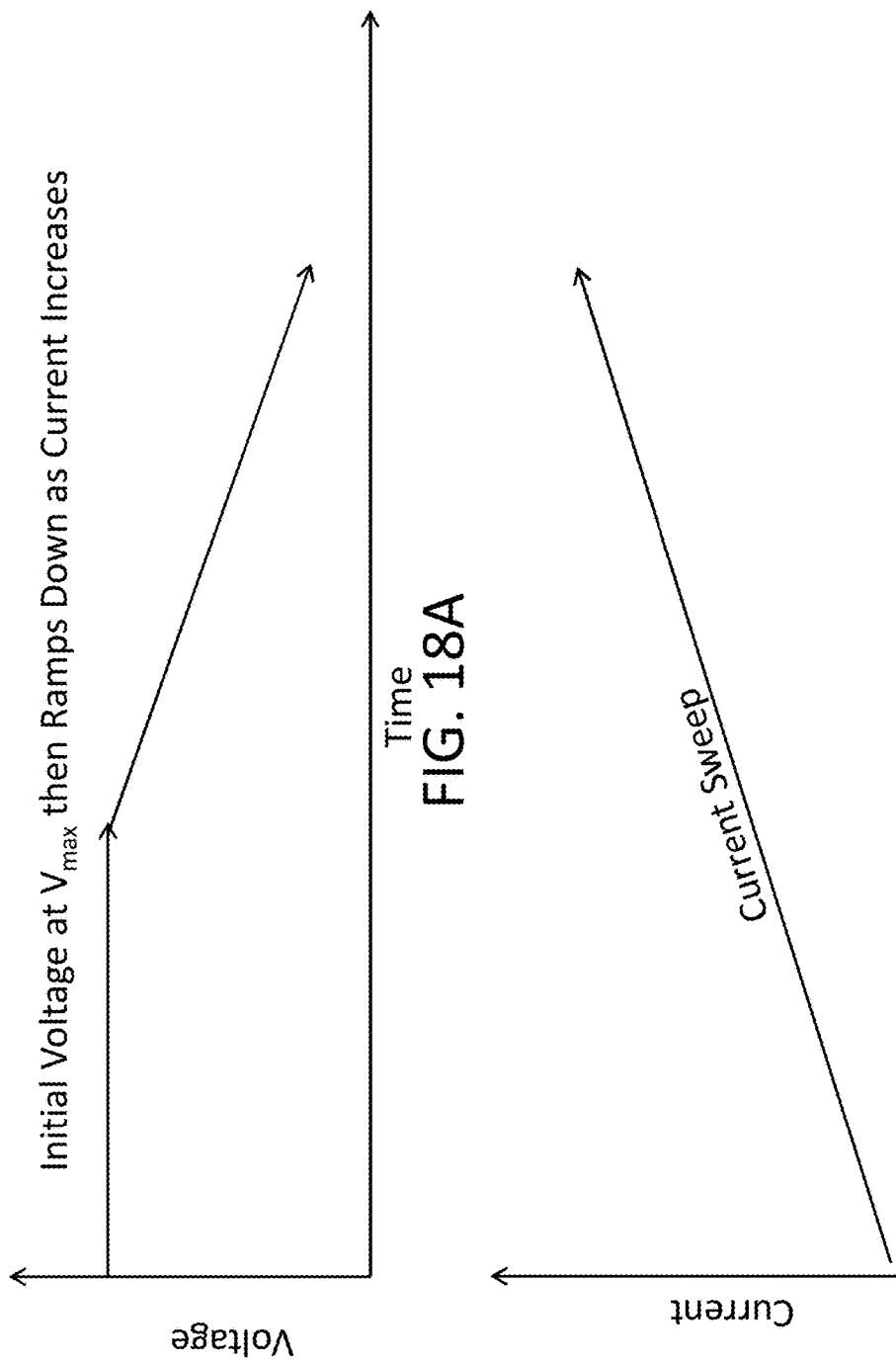

RESISTIVE RANDOM ACCESS MEMORY (RRAM) CELL FILAMENT FORMATION USING CURRENT WAVEFORMS

RELATED APPLICATION

This application claims the benefit of the Singaporean Patent Application No. 10201606137Y filed on Jul. 26, 2016.

FIELD OF THE INVENTION

The present invention relates to non-volatile memory, and more specifically to resistive random access memory.

BACKGROUND OF THE INVENTION

Resistive random access memory (RRAM) is a type of nonvolatile memory. Generally, RRAM memory cells each include a resistive dielectric material layer sandwiched between two conductive electrodes. The dielectric material is normally insulating. However, by applying the proper voltage across the dielectric layer, a conduction path (typically referred to as a filament) can be formed through the dielectric material layer. Once the filament is formed, it can be "reset" (i.e., broken or ruptured, resulting in a high resistance across the RRAM cell) and set (i.e., re-formed, resulting in a lower resistance across the RRAM cell), by applying the appropriate voltages across the dielectric layer. The low and high resistance states can be utilized to indicate a digital signal of "1" or "0" depending upon the resistance state, and thereby provide a reprogrammable non-volatile memory cell that can store a bit of information.

FIG. 1 shows a conventional configuration of an RRAM memory cell 1. The memory cell 1 includes a resistive dielectric material layer 2 sandwiched between two conductive material layers that form top and bottom electrodes 3 and 4, respectively.

FIGS. 2A-2D show the switching mechanism of the dielectric material layer 2. Specifically, FIG. 2A shows the resistive dielectric material layer 2 in its initial state after fabrication, where the layer 2 exhibits a relatively high resistance. FIG. 2B shows the formation of a conductive filament 7 through the layer 2 by applying the appropriate voltage across the layer 2. The filament 7 is a conductive path through the layer 2, such that the layer exhibits a relatively low resistance across it (because of the relatively high conductivity of the filament 7). FIG. 2C shows the formation of a rupture 8 in filament 7 caused by the application of a "reset" voltage across the layer 2. The area of the rupture 8 has a relatively high resistance, so that layer 2 exhibits a relatively high resistance across it. FIG. 2D shows the restoration of the filament 7 in the area of the rupture 8 caused by the application of a "set" voltage across layer 2. The restored filament 7 means the layer 2 exhibits a relatively low resistance across it. The relatively low resistance of layer 2 in the "formation" or "set" states of FIGS. 2B and 2D respectively can represent a digital signal state (e.g. a "1"), and the relatively high resistance of layer 2 in the "reset" state of FIG. 2C can represent a different digital signal state (e.g. a "0"). The reset voltage (which breaks the filament) can have a polarity opposite that of the filament formation and the set voltages, but it can also have the same polarity. The RRAM cell 1 can repeatedly be "reset" and "set," so it forms an ideal reprogrammable nonvolatile memory cell.

One of the most critical operations involves the initial formation of the filament, as it will define the switching characteristics of the memory cell (e.g. operational power, device-to-device resistance variation, etc.). The voltage needed to form the filament is relatively high (i.e. significantly higher than the voltages needed to set and reset the memory cell). Using a filament forming voltage that is too low will not adequately form the filament. Using an excessive filament forming voltage could cause uncontrolled filament formation which can damage the device and result in inferior resistance switching behaviors, or result in over-forming the filament. Over-forming results in higher set and reset voltage peaks (which many circuit applications cannot accommodate), cycling induced resistance degradation, poor reset and set resistance distributions, and cell performance degradation. Therefore, there is a need for a reliable and effective technique for initially forming the filaments in RRAM devices.

BRIEF SUMMARY OF THE INVENTION

The aforementioned problems and needs are addressed by a method of forming a conductive filament in metal oxide material disposed between and in electrical contact with first and second conductive electrodes. The method includes applying one or more electrical current pulses through the metal oxide material, wherein for each of the one or more electrical current pulses, an amplitude of the electrical current increases over time during the electrical current pulse.

A memory device includes a metal oxide material disposed between and in electrical contact with first and second conductive electrodes, and an electrical current source configured to apply one or more electrical current pulses through the metal oxide material. For each of the one or more electrical current pulses, an amplitude of the electrical current increases over time during the electrical current pulse.

A memory device includes a plurality of memory cells, an electrical current source and a voltage source. Each memory cell includes a metal oxide material disposed between and in electrical contact with first and second conductive electrodes, and a transistor connected to the second conductive electrode and having a gate electrode. The electrical current source is configured to apply one or more electrical current pulses through the memory cells, wherein for each of the one or more electrical current pulses, an amplitude of the electrical current increases over time during the electrical current pulse. The voltage source is electrically connected to the gate electrodes of the transistors of the plurality of memory cells.

Other objects and features of the present invention will become apparent by a review of the specification, claims and appended figures.

BRIEF DESCRIPTION OF THE DRAWINGS

FIG. 17A is a graph illustrating a voltage applied to the terminal of the RRAM cell that ramps down during the sweep over time.

FIG. 17B is a graph illustrating a current through the RRAM cell that ramps up during the sweep over time.

FIG. 18A is a graph illustrating a voltage applied to the terminal of the RRAM cell that is initially constant but then ramps down during the sweep over time.

FIG. 18B is a graph illustrating a current through the RRAM cell that ramps up during the sweep over time.

DETAILED DESCRIPTION OF THE INVENTION

The present invention is an improved technique for initially forming the filament in an RRAM device cell. The technique involves precisely controlling one or more (electrical) current sweeps with increasing or ramping (electrical) current (e.g. linear, logarithmic, combination of both, etc.), to gently form filaments without excessive electrical currents that will damage the memory cell. The application of one or more controlled current sweeps can end at a preset value, or can end after it is determined that the cell has reached a desired resistance level.

Figure 1:
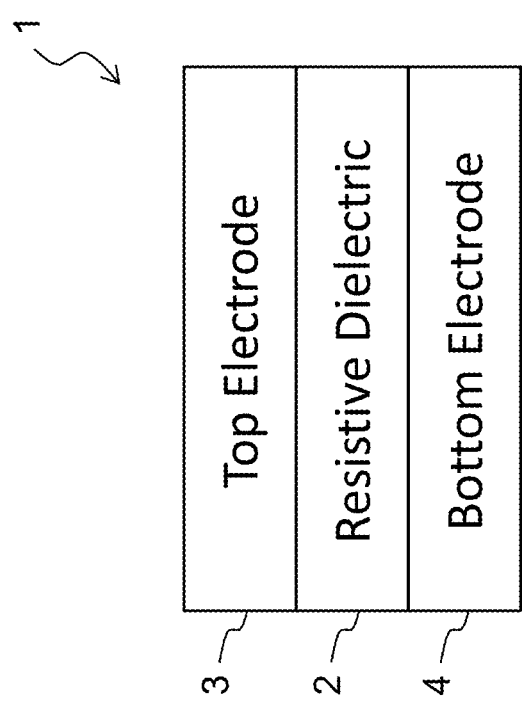
FIG. 1 is a side cross sectional view of a conventional Resistive Random Access Memory (RRAM) cell.
Figure 2A:
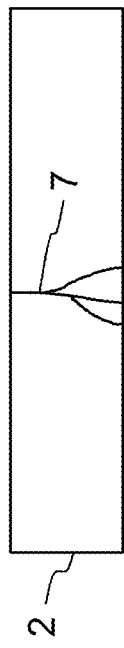
FIG. 2A is a side cross sectional view of the resistive dielectric layer of the conventional RRAM cell in its initial state.
Figure 2B:
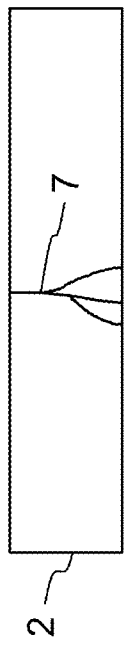
FIG. 2B is a side cross sectional view of the resistive dielectric layer of the conventional RRAM cell in its formed state.
Figure 2C:
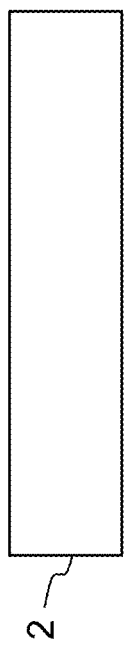
FIG. 2C is a side cross sectional view of the resistive dielectric layer of the conventional RRAM cell in its reset state.
Figure 2D:
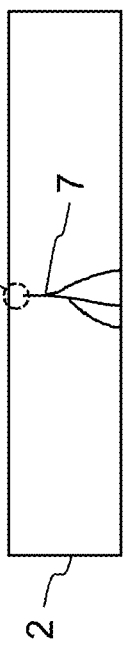
FIG. 2D is a side cross sectional view of the resistive dielectric layer of the conventional RRAM cell in its set state.
Figure 3:
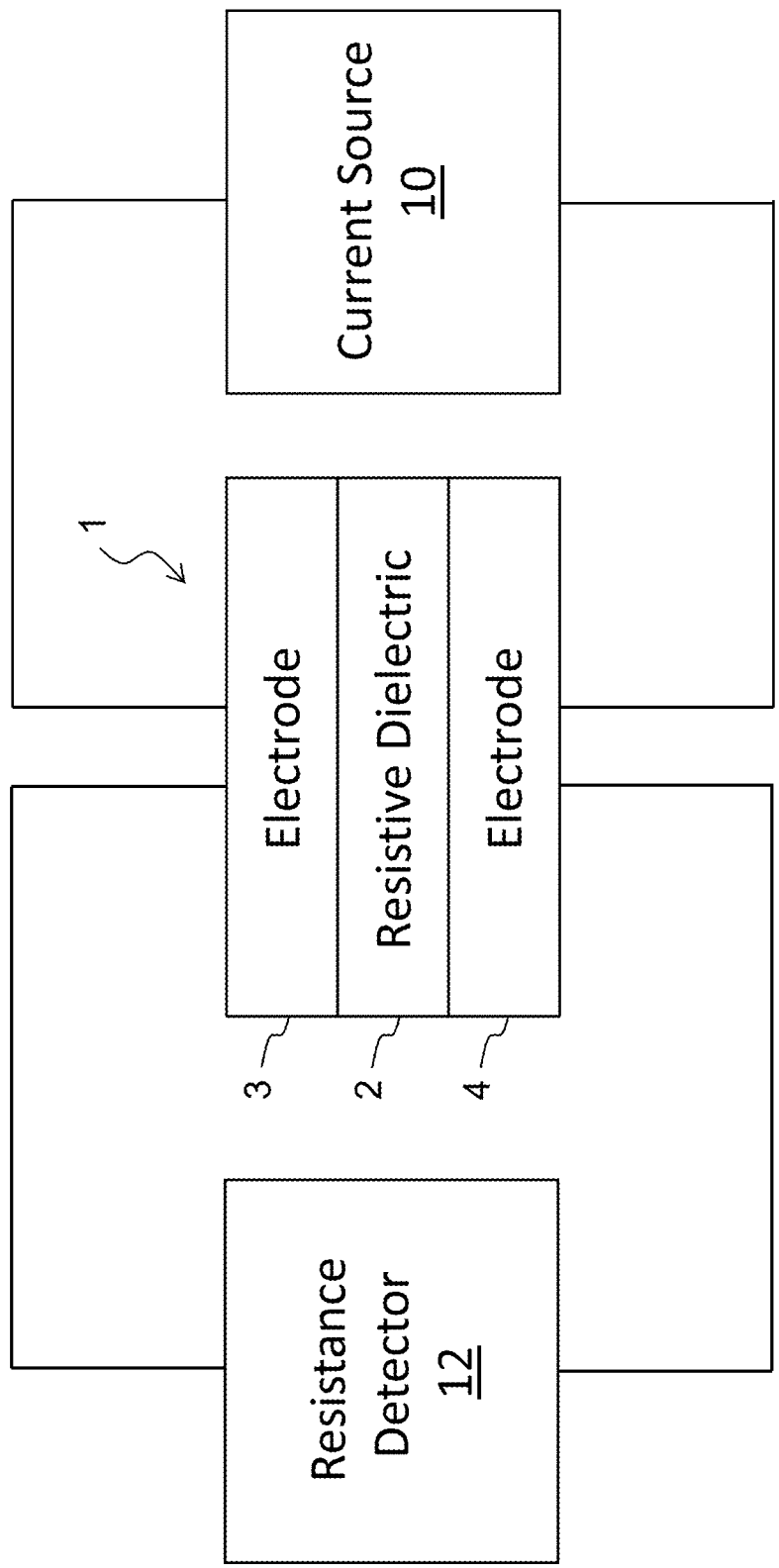
FIG. 3 is a schematic diagram showing the basic components of the RRAM memory device.

FIG. 3 illustrates the high level basic structure of an RRAM memory device, which includes the previously described RRAM cell 1, a current source 10 for applying controlled currents through the memory cell 1 for filament formation, cell reset and cell set. A resistance detector 12 can be used to measure the electrical resistance across the RRAM cell 1 for filament formation and determining the state of the RRAM cell 1 (i.e. reading the cell). It should be appreciated that while FIG. 3 illustrates only a single RRAM cell 1, the current source 10 and resistance detector 12 are connected to and operate on an array of RRAM cells 1. It should also be appreciated at the current source 10 and resistance detector 12 could be formed as a single integrated device. Preferably, the electrodes 3 and 4 are made of a metal material (e.g., Pt, Ti, TiN, Ru, Ni, TaN, W, etc.) and resistive dielectric layer 2 is made of a metal oxide (e.g., HfOx, TaOx, TiOx, WOx, Vox, CuOx, etc.). Alternatively, resistive dielectric layer 2 can be a composite of discrete sub-layers (e.g. layer 2 could be multiple layers. For example, layer 2 can include bilayers (e.g., TaOx/AlOx, TaOx/HfOx, HfOx/AlOx), or triple layers (e.g., a Hf layer disposed between a TaOx layer and a HfOx layer, or a Ti layer disposed between a TaOx layer and HfOx layer).

Figure 4:
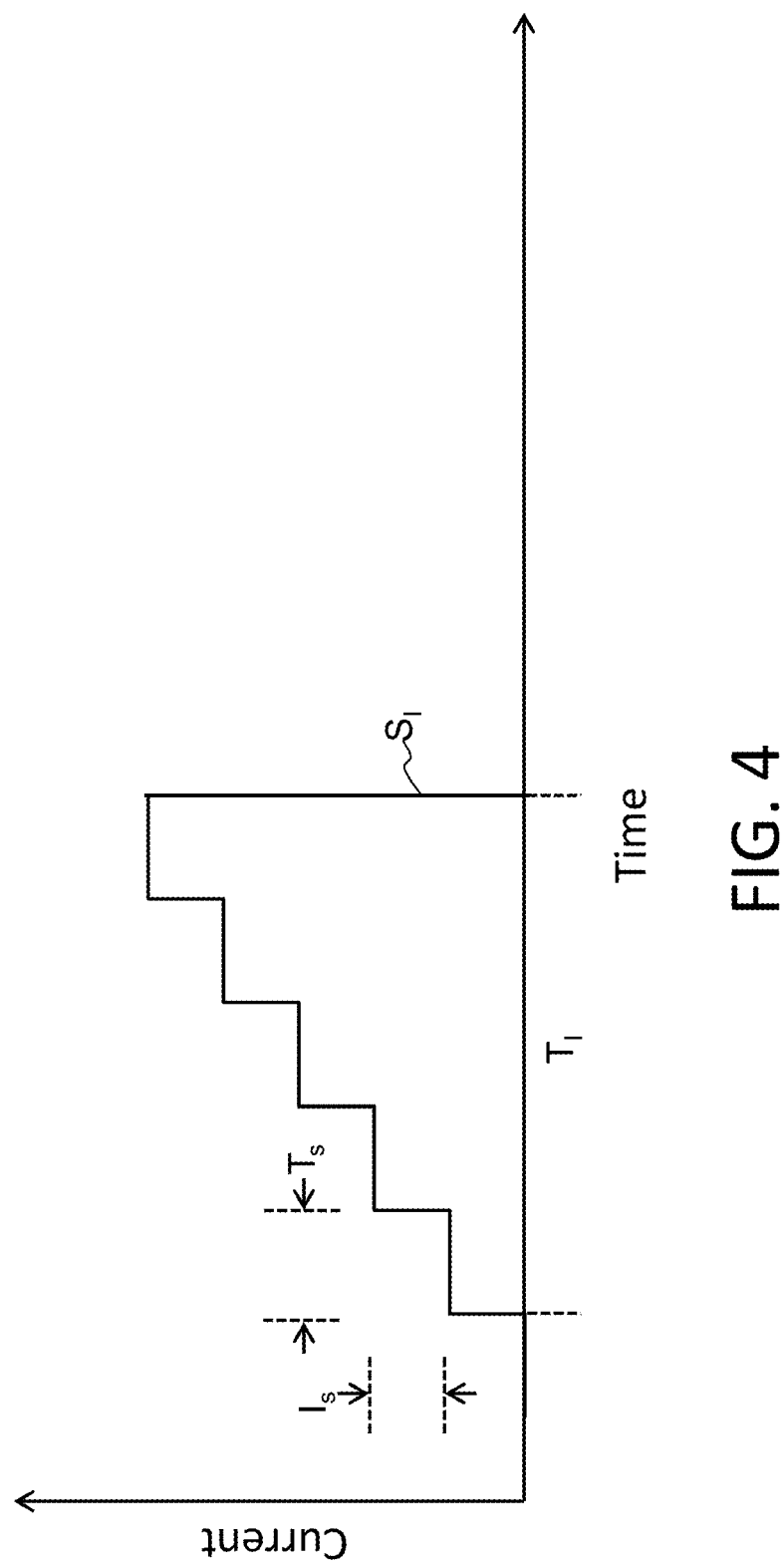
FIG. 4 is a graph illustrating a current sweep waveform applied to form the filament in the RRAM cell.

FIG. 4 illustrates the current sweep $S_I$ applied across electrodes 3 and 4 by current source 10 for forming the filament in the resistive dielectric layer 2. Within sweep $S_I$, the current increases in increments (i.e., current steps $I_s$), each with an increment duration $T_s$, in a stair-step fashion (as plotted linearly, logarithmically, or a combination of both). Specifically, sweep $S_I$ has a first incremental current $I_s$ applied for an incremental time $T_s$. Then the applied current is increased by an additional $I_s$ and this second incremental current is applied for incremental time $T_s$. Then the applied current is increased again by an additional $I_s$ and this third incremental current is applied for incremental time $T_s$, and so on, for a total sweep time period of $T_I$. The filament forming process ends by reaching the end of the current sweep $S_I$ of a predetermined number of steps and overall time period. Or, the resistance of the resistive dielectric layer 2 could be measured by resistance detector 12 (which monitors the voltage and current of the RRAM memory cell 1) and the current sweep can be stopped once the resistance reaches a desired value which verifies that the filament has been properly formed (i.e. forming verification), or a combination of the above (i.e. cease the process by reaching the predetermined number of steps unless the measured resistance drops below a predetermined threshold first).

Figure 5:
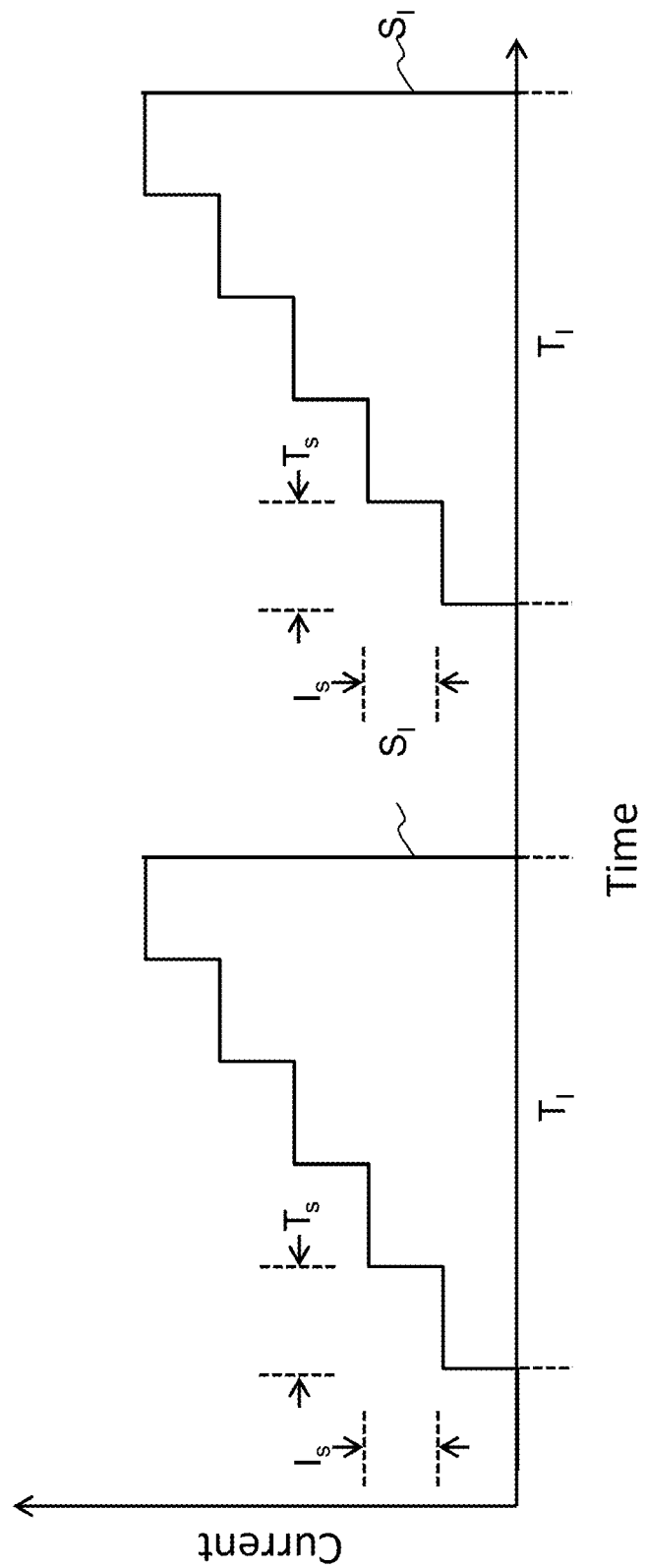
FIG. 5 is a graph illustrating multiple current sweep waveforms applied to form the filament in the RRAM cell.
Figure 6:
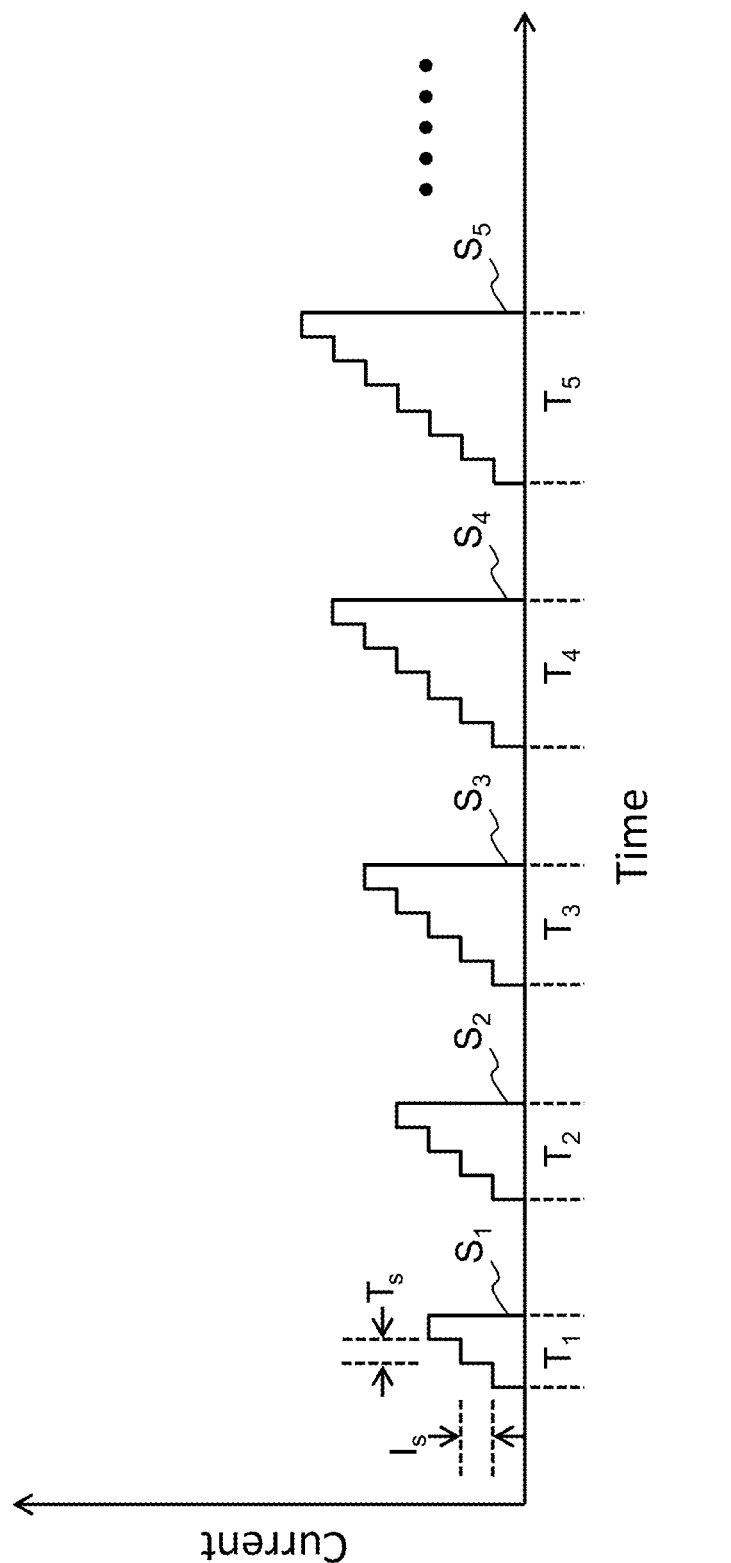
FIG. 6 is a graph illustrating multiple current sweep waveforms applied to form the filament in the RRAM cell.
Figure 7:
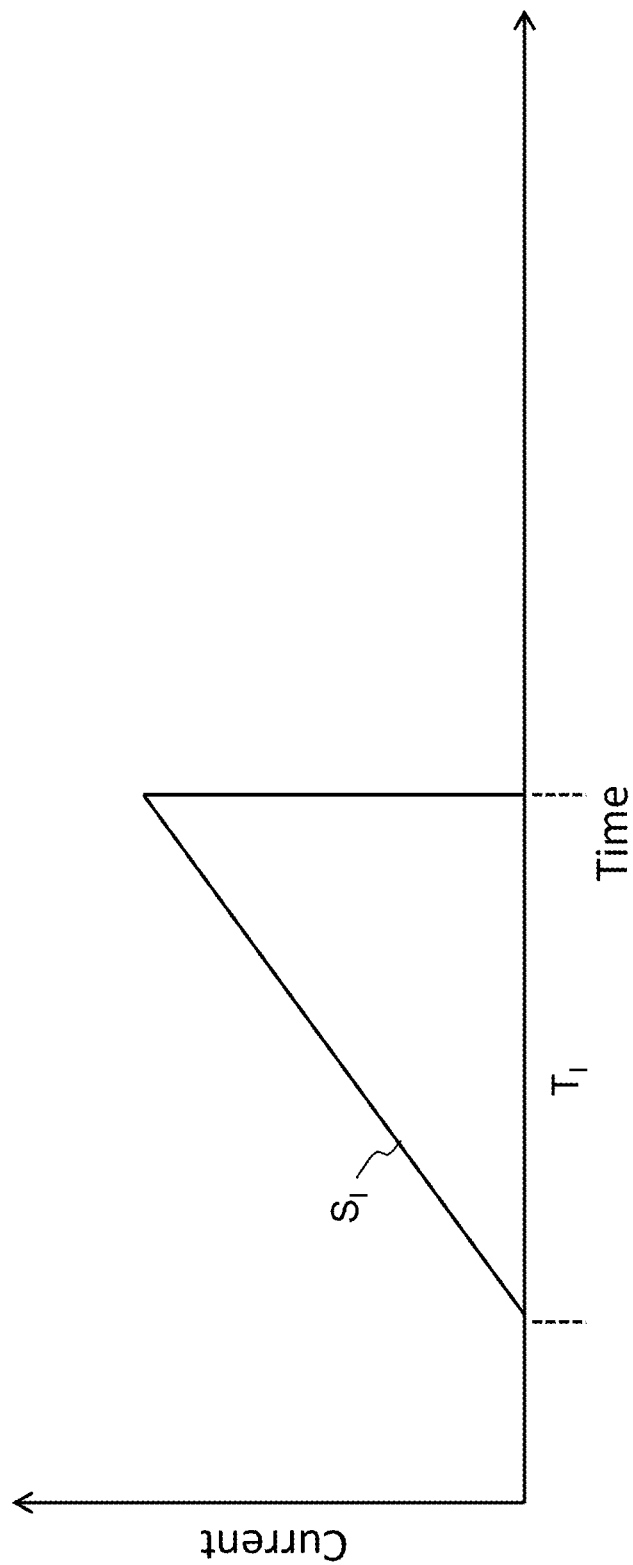
FIG. 7 is a graph illustrating a current sweep waveform applied to form the filament in the RRAM cell.
Figure 8:
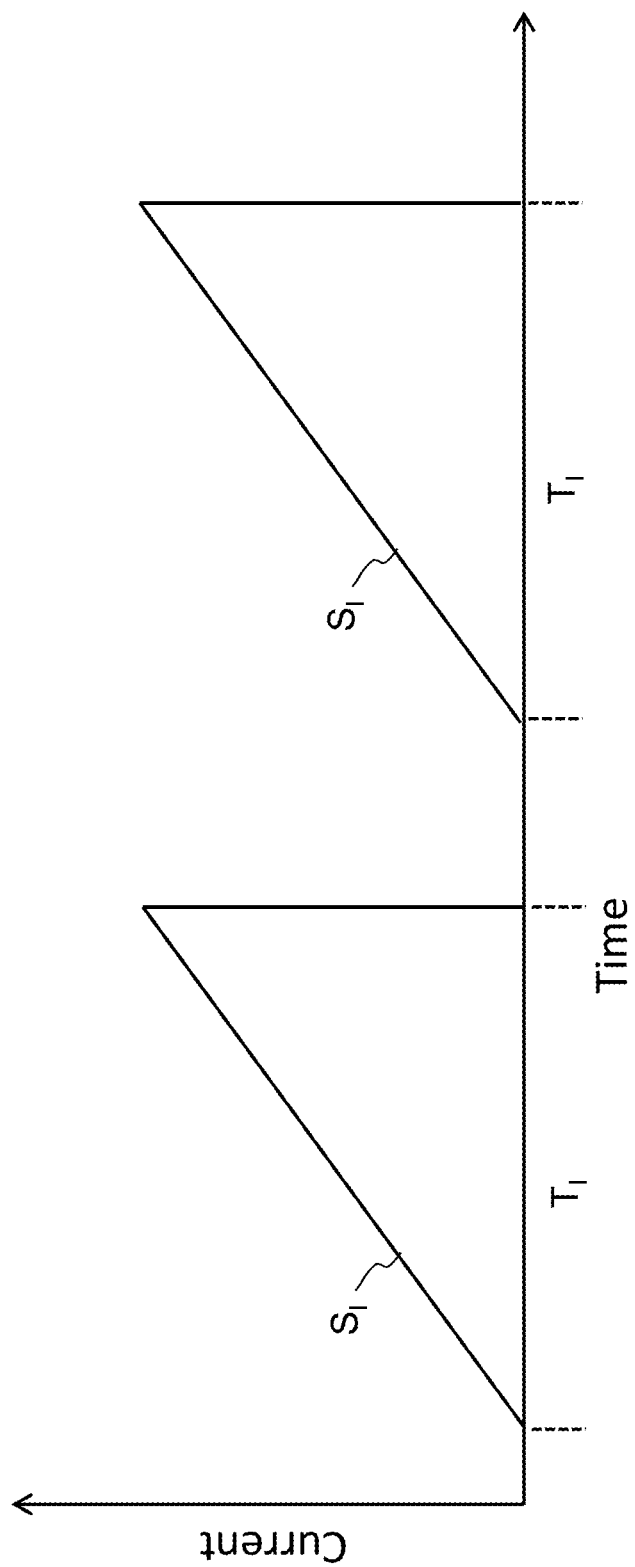
FIG. 8 is a graph illustrating multiple current sweep waveforms applied to form the filament in the RRAM cell.
Figure 9:
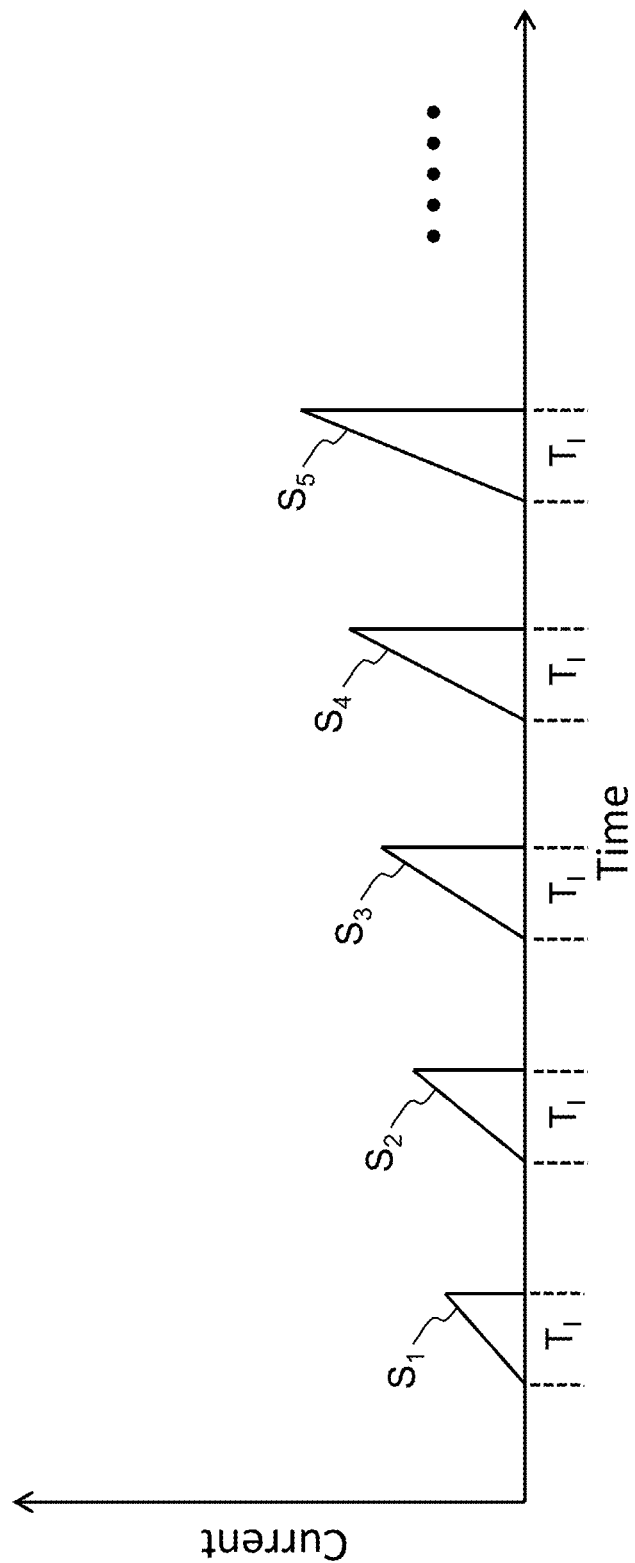
FIG. 9 is a graph illustrating multiple current sweep waveforms applied to form the filament in the RRAM cell.

If it is determined that the desired resistance is not met after the current sweep $S_I$ has been applied, one or more subsequent current sweeps $S_I$ can be applied (see FIG. 5). The time duration, number of steps and/or maximum current value of the subsequent current sweeps can vary (see FIG. 6). Instead of discrete steps, the current sweep $S_I$ can be applied in an analog ramping manner (see FIG. 7), with subsequent analog ramping sweeps as needed (see FIG. 8), with varying time duration, slope and/or maximum current values (see FIG. 9).

Figure 10:
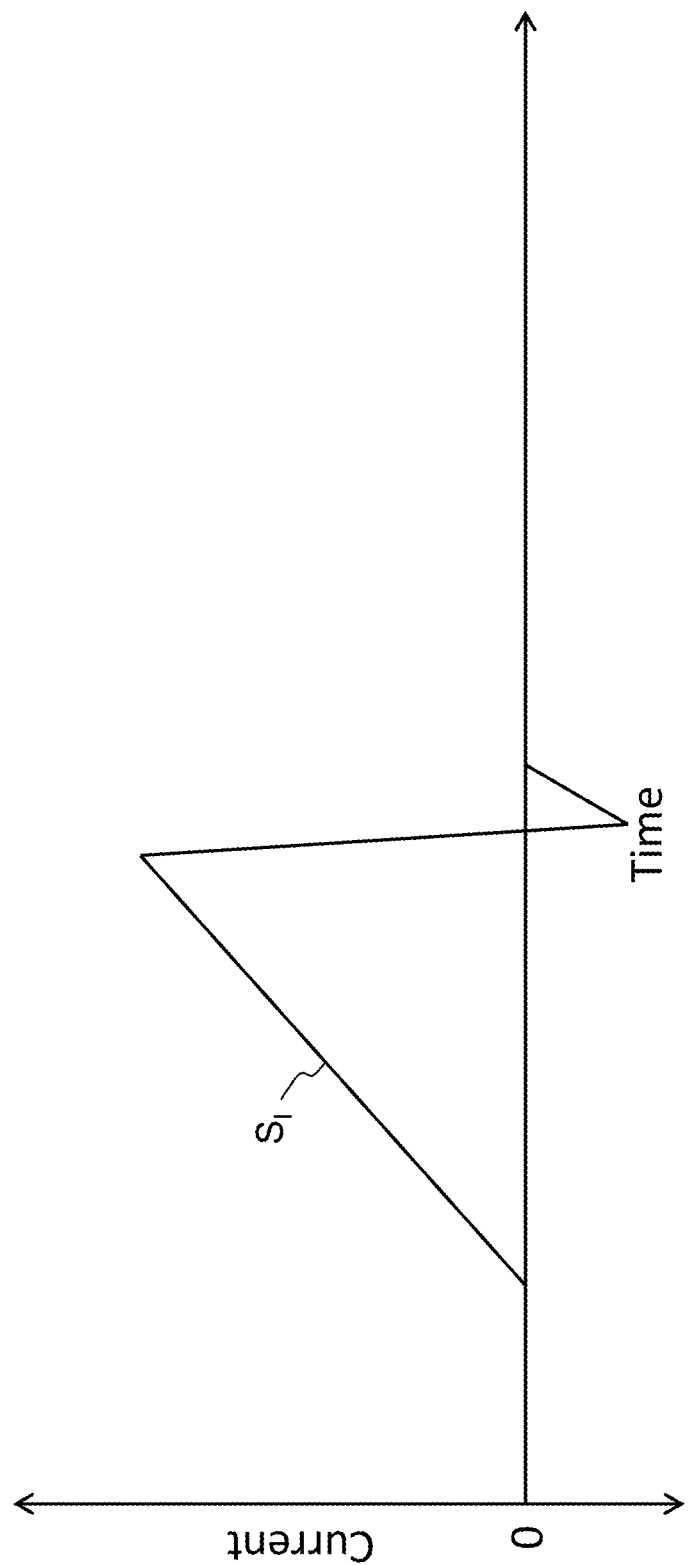
FIG. 10 is a graph illustrating a current sweep waveform with a reverse bias current applied to form the filament in the RRAM cell.
Figure 11:
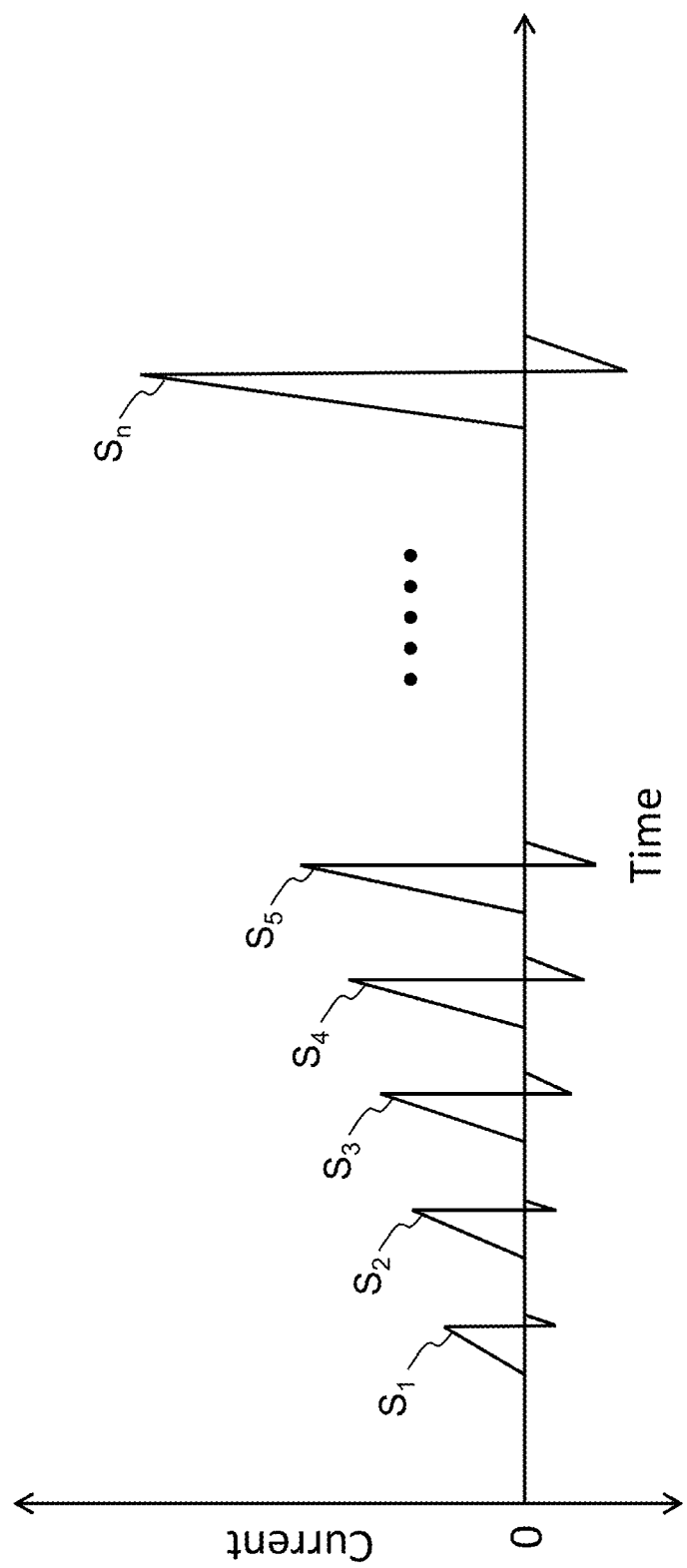
FIG. 11 is a graph illustrating multiple current sweep waveforms with reverse bias currents applied to form the filament in the RRAM cell.

FIG. 10 illustrates an alternate waveform sweep $S_I$ that can be applied across electrodes 3 and 4 for forming the filament. This waveform is similar to that of FIG. 4, but with the addition of a small reverse bias current at the end of the sweep $S_I$ (i.e. a current of reverse polarity but smaller amplitude compared to that of most the sweep $S_I$). The reverse bias helps stabilize the oxygen vacancies that form the filament. If multiple current sweeps are used, the reverse bias currents can vary from sweep to sweep in amplitude and/or duration (e.g. the amplitude of reverse bias currents can increase from sweep to sweep as shown in FIG. 11). The reverse bias current of these waveforms can be added to any of the previously discussed waveforms.

Figure 12:
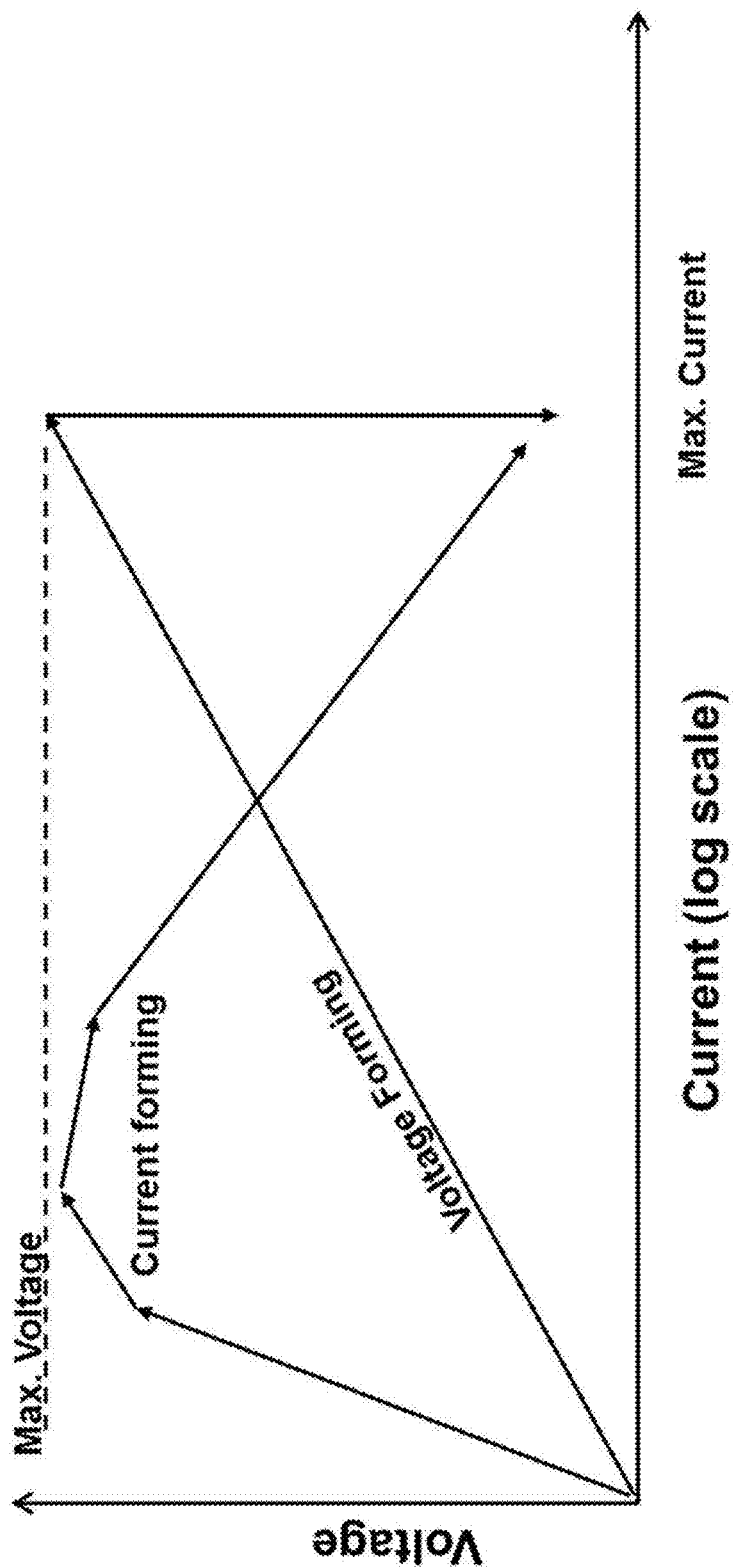
FIG. 12 is a graph illustrating the current versus voltage curves for forming the filament in the RRAM cell using current forming and using voltage forming.

Applying a controlled current for filament formation is advantageous over applying a controlled voltage. FIG. 12 compares current versus voltage curves during filament formation by controlling voltage, and by controlling current as described above. Controlling just voltage to form the filament (voltage forming) would result in a gradual increase in current as voltage rises. However, when the desired filament formation is achieved, the resistance would suddenly drop, causing the voltage to drop suddenly, making it difficult to control over-programming. With voltage forming, the peak voltage and peak current often coincide. In contrast, controlling just current to form the filament (current forming) results in a peak voltage well before the desired filament formation is achieved. The maximum voltage always occurs at lower current. Therefore, it is less likely to result in a sudden forming transition, and therefore is easier to control over-programming, by employing current forming.

Figure 13:
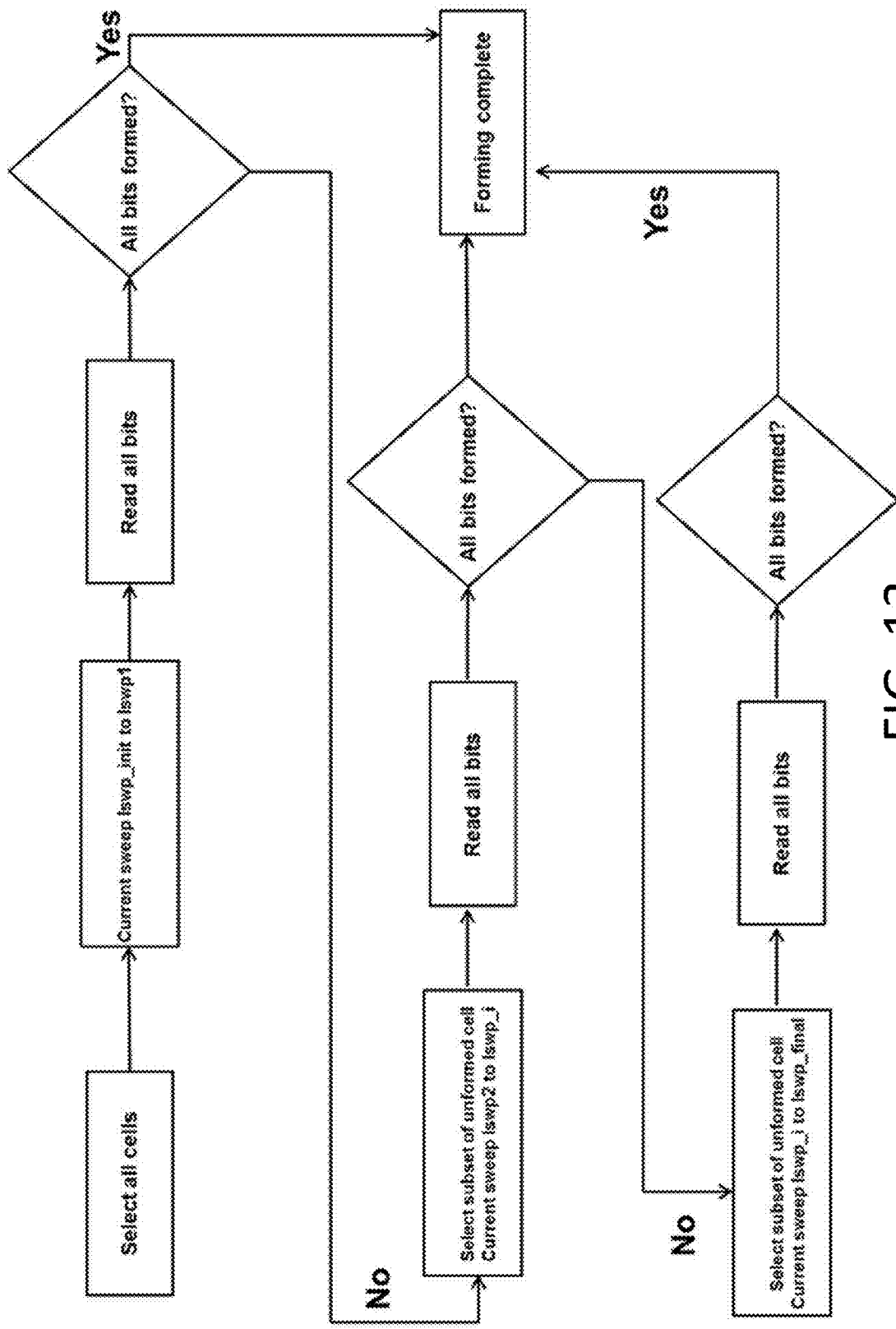
FIG. 13 is a flow diagram illustrating an exemplary methodology of mass forming of filaments in an array of RRAM cells.
Figure 14:
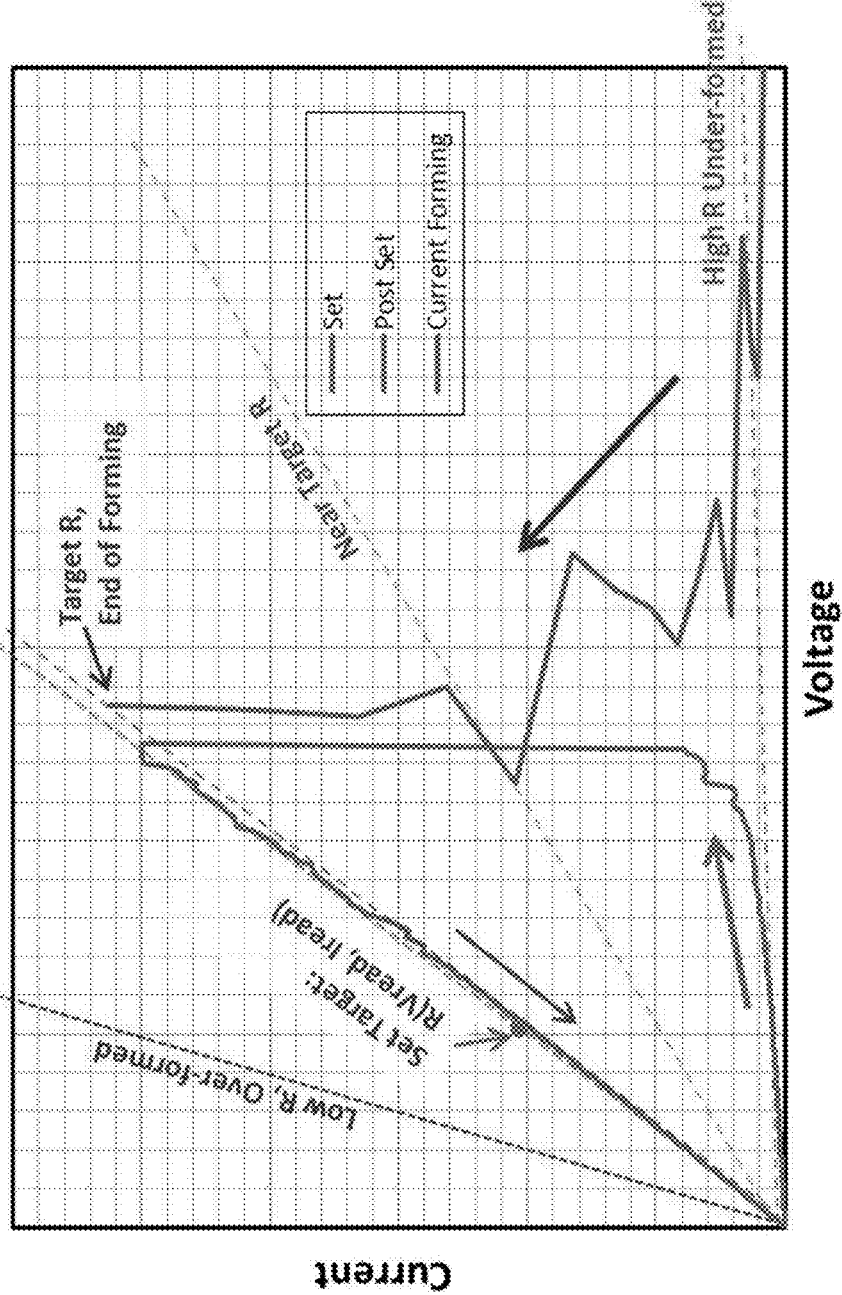
FIG. 14 is a graph illustrating the current/voltage curves for the filament forming process and the end of forming target.

FIG. 13 illustrates an exemplary methodology of mass forming of filaments in an array of cells. FIG. 14 illustrates the forming process and "end of forming" target, which can be set using technology targets. As illustrated by the current forming curve, current is initially very low at higher voltages (mostly tunneling current). As the filament is formed, the current rises at lower voltages. Therefore, filament formation (and the avoidance of over programming) is best controlled by sweeping the current.

Figure 15:
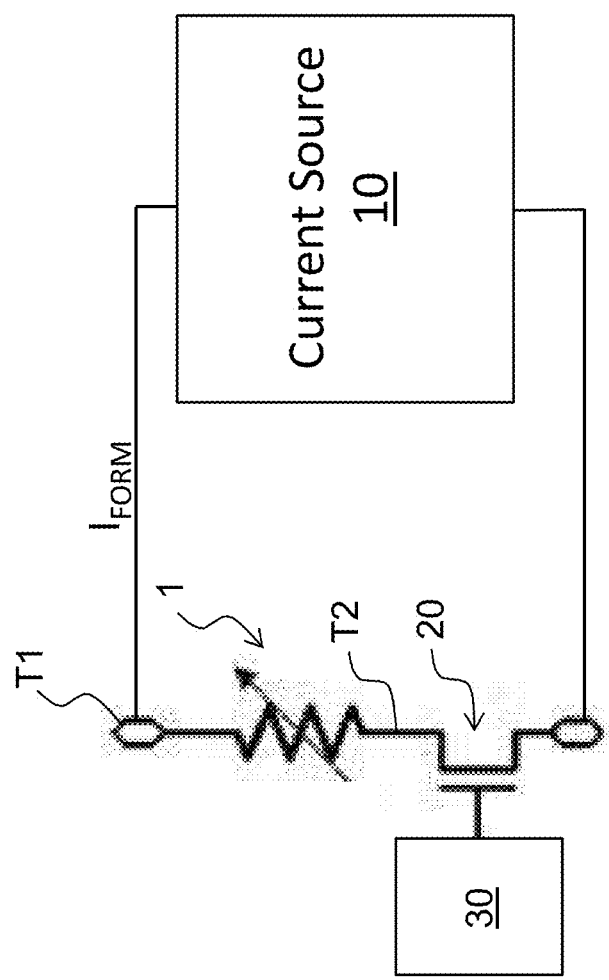
FIG. 15 is a diagram illustrating circuitry for applying the current sweep waveform(s).
Figure 16A:
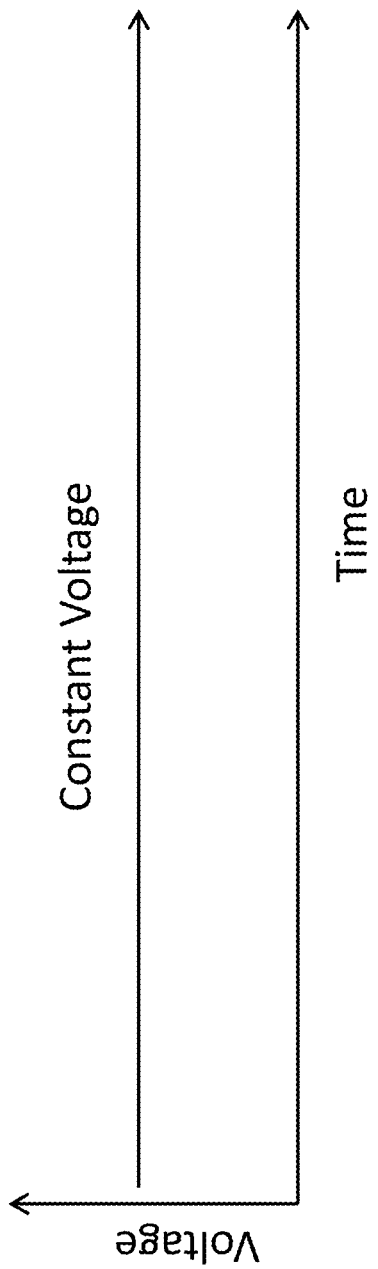
FIG. 16A is a graph illustrating a voltage applied to the terminal of the RRAM cell that is constant during the sweep over time.
Figure 16B:
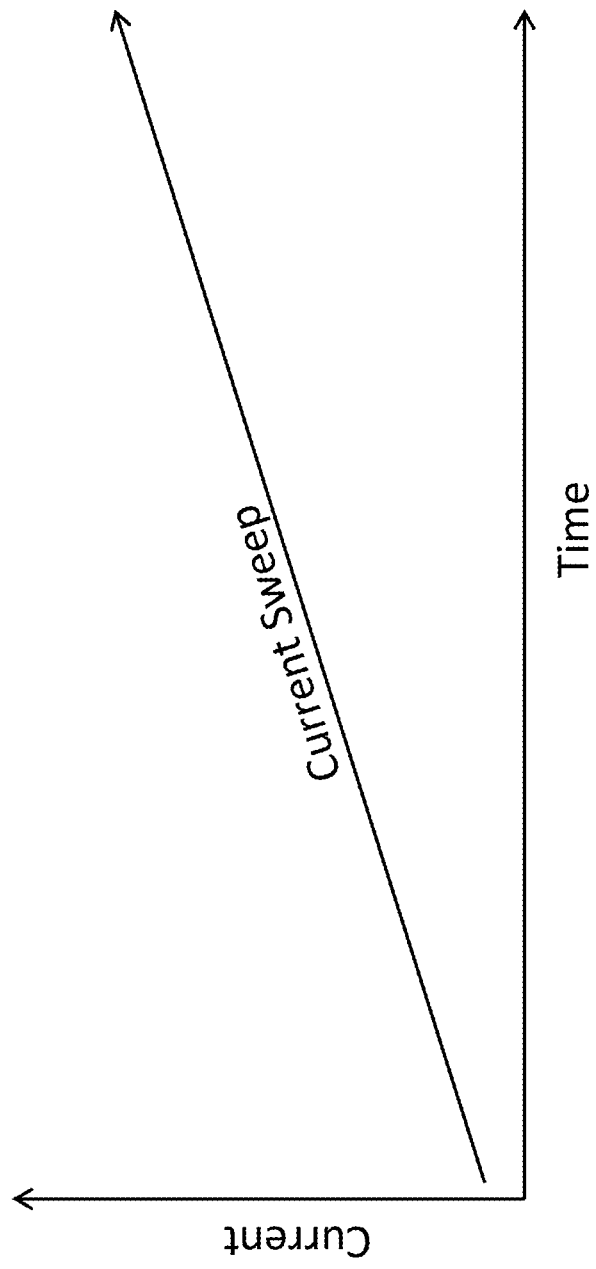
FIG. 16B is a graph illustrating a current through the RRAM cell that ramps up during the sweep over time.
Figure 19:
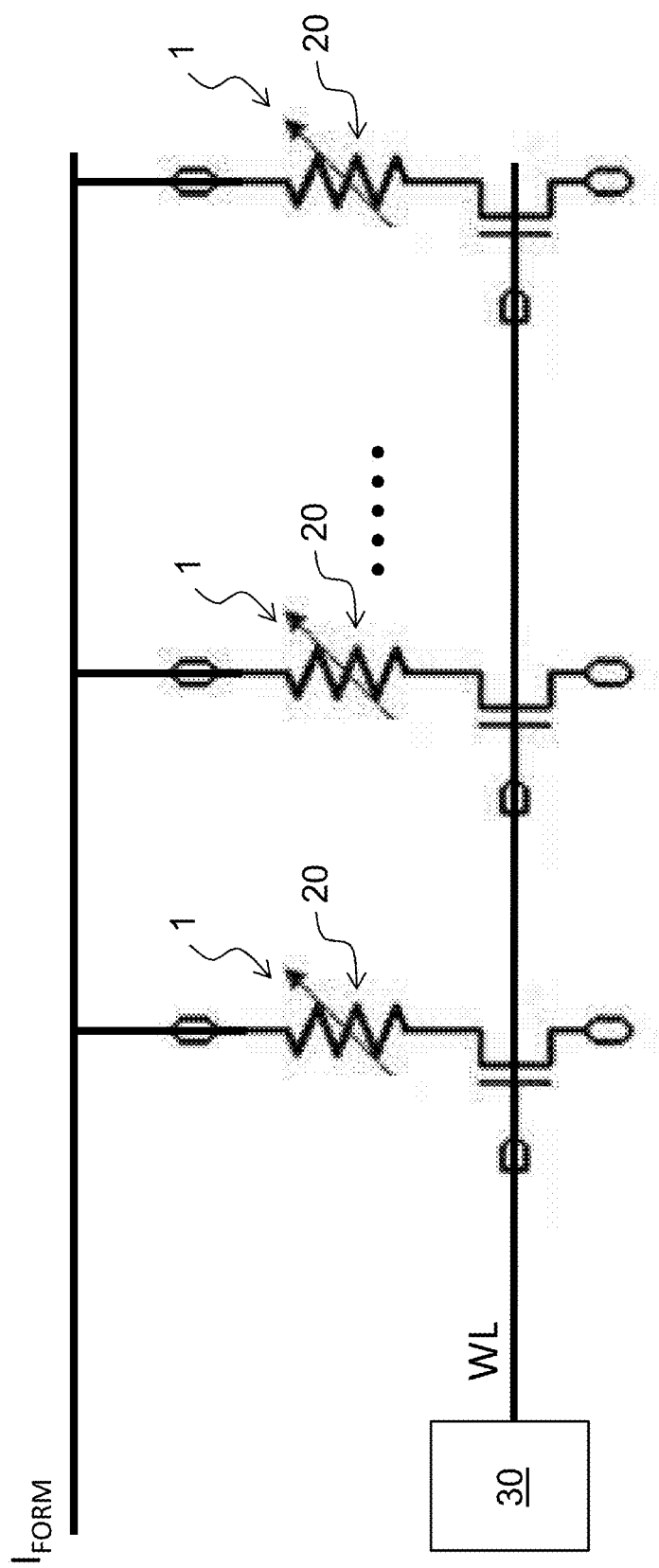
FIG. 19 is a diagram illustrating circuitry for applying the current sweep waveform(s) to an array of RRAM cells.

FIG. 15 illustrates circuitry for applying the above described current sweeps. RRAM memory cell 1 includes a terminal T1 connected to the top electrode 3, and a bottom terminal T2 connected to the bottom electrode 4. A transistor 20 is connected in series with the RRAM memory cell to regulate the current running through the RRAM memory cell under the control of a voltage source 30 connected to a gate electrode of the transistor 20. Transistor 20 allows current control independent of the voltage applied to terminal T1 of the RRAM memory cells. For example, as shown in FIG. 16A, the voltage applied to terminal T1 is constant, but as shown in FIG. 16B, the current driven through the RRAM memory cell ramps up during the sweep. As shown in FIGS. 17A and 17B, the voltage is ramped downwardly while the current is ramped upwardly throughout the current sweep. As shown in FIGS. 18A and 18B, the initial voltage is held constant at Vmax during the first part of the current sweep, and then is ramped down during the second part of the current sweep. As shown in FIG. 19, filament formation can be implemented in multiple RRAM memory cells 1 using a single word line WL that connects to the transistors' gate electrodes for driving multiple current regulation transistors.

Filament formation using current sweeps (with controlled current) described above provides better control (including when involving high numbers of cells), exhibit low set/reset current and desirable set currents, consumes less power, and results in tighter set and reset current distributions compared to voltage forming methods.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the specification, not all method steps need be performed in the exact order illustrated or claimed. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a conductive filament in metal oxide material disposed between and in electrical contact with a first and a second conductive electrodes, the method comprising:
    applying a plurality of electrical current pulses through the metal oxide material;
    wherein for each of the plurality of electrical current pulses, an amplitude of the electrical current increases over time during the electrical current pulse; and
    wherein the method includes at least one of:
        the amplitude of the electrical current for each of the plurality of electrical current pulses increases in discrete steps,
        at least one of the plurality of electrical current pulses varies in amplitude, duration or a rate of gradual increase of the amplitude relative to another of the plurality of electrical current pulses,
        measuring a resistance of the metal oxide material after each of the plurality of the electrical current pulses, and
        the applying of the plurality of the electrical current pulses through the metal oxide material includes applying at least one of a constant or downwardly ramping voltage to the first conductive electrode.

2. The method of claim 1, wherein for each of the plurality of the electrical current pulses, the amplitude of the electrical current increases in discrete steps.

3. The method of claim 2, wherein for each of the plurality of the electrical current pulses, the number of the discrete steps exceeds that of any of the plurality of the electrical current pulses preceding the electrical current pulse.

4. The method of claim 1, wherein for each of the plurality of the electrical current pulses, the maximum of the electrical current amplitude exceeds that of any of the plurality of the electrical current pulses preceding the electrical current pulse.

5. The method of claim 1, wherein for each of the plurality of the electrical current pulses, the duration of the one electrical current pulse exceeds that of any of the plurality of the electrical current pulses preceding the electrical current pulse.

6. The method of claim 1, wherein for each of the plurality of the electrical current pulses:
   the amplitude of the electrical current increases gradually, and
   the gradual increase of the electrical current amplitude is at a rate that exceeds that of any of the plurality of electrical current pulses preceding the electrical current pulse.

7. The method of claim 1, wherein each of the plurality of the electrical current pulses includes a first portion with a first polarity and a second portion with a second polarity opposite to the first polarity.

8. The method of claim 1, further comprising:
   the measuring of the resistance of the metal oxide material after each of the plurality of the electrical current pulses; and
   ceasing the applying of the plurality of the electrical current pulses in response to the measured resistance being below a predetermined threshold.

9. The method of claim 1, wherein a transistor is electrically connected to the second conductive electrode, and wherein the applying of the plurality of the electrical current pulses through the metal oxide material includes applying the constant voltage to the first conductive electrode.

10. The method of claim 1, wherein a transistor is electrically connected to the second conductive electrode, and wherein the applying of the plurality of the electrical current pulses through the metal oxide material includes applying the downwardly ramping voltage to the first conductive electrode.

11. The method of claim 1, wherein a transistor is electrically connected to the second conductive electrode, and wherein the applying of the plurality of the electrical current pulses through the metal oxide material includes initially applying the constant voltage to the first conductive electrode, and then applying the downwardly ramping voltage to the first conductive electrode.

12. A memory device comprising:
   a metal oxide material disposed between and in electrical contact with a first and a second conductive electrodes;
   an electrical current source configured to apply a plurality of electrical current pulses through the metal oxide material;
   wherein for each of the plurality of electrical current pulses, an amplitude of the electrical current increases over time during the electrical current pulse;
   wherein the memory devices further includes at least one of:
      the amplitude of the electrical current for each of the plurality of electrical current pulses increases in discrete steps,
      at least one of the plurality of electrical current pulses varies in amplitude, duration or a rate of gradual increase of the amplitude relative to another of the plurality of electrical current pulses,
      a resistance detector for measuring a resistance of the metal oxide material after each of the plurality of the electrical current pulses, and
      a transistor connected to the second conductive electrode and a voltage source connected to a gate electrode of the transistor configured to apply at least one of a constant or downwardly ramping voltage to the first conductive electrode during the plurality of the electrical current pulses.

13. The memory device of claim 12, wherein for each of the plurality of the electrical current pulses, the amplitude of the electrical current increases in discrete steps.

14. The memory device of claim 13, wherein for each of the plurality of the electrical current pulses, the number of the discrete steps exceeds that of any of the plurality of the electrical current pulses preceding the electrical current pulse.

15. The memory device of claim 12, wherein for each of the plurality of the electrical current pulses, the maximum of the electrical current amplitude exceeds that of any of the plurality of the electrical current pulses preceding the electrical current pulse.

16. The memory device of claim 12, wherein for each of the plurality of the electrical current pulses, the duration of the one electrical current pulse exceeds that of any of the plurality of the electrical current pulses preceding the electrical current pulse.

17. The memory device of claim 12, wherein for each of the plurality of the electrical current pulses:
   the amplitude of the electrical current increases gradually, and
   the gradual increase of the electrical current amplitude is at a rate that exceeds that of any of the plurality of electrical current pulses preceding the electrical current pulse.

18. The memory device of claim 12, wherein each of the plurality of the electrical current pulses includes a first portion with a first polarity and a second portion with a second polarity opposite to the first polarity.

19. The memory device of claim 12, further comprising:
   the resistance detector configured to measure the resistance of the metal oxide material after each of the plurality of the electrical current pulses, wherein the current source is configured to cease the applying of the plurality of the electrical current pulses in response to the measured resistance being below a predetermined threshold.

20. The memory device of claim 12, further comprising:
   the transistor connected to the second conductive electrode;
   the voltage source connected to a gate electrode of the transistor;
   wherein the voltage source and the electrical current source are configured to apply a constant voltage to the first conductive electrode during the plurality of the electrical current pulses.

21. The memory device of claim 12, further comprising:
   the transistor connected to the second conductive electrode;
   the voltage source connected to a gate electrode of the transistor;
   wherein the voltage source and the electrical current source are configured to apply a downwardly ramping voltage to the first conductive electrode during the plurality of the electrical current pulses.

22. The memory device of claim 12, further comprising:
   the transistor connected to the second conductive electrode;
   the voltage source connected to a gate electrode of the transistor;

wherein the voltage source and the electrical current source are configured to initially apply a constant voltage to the first conductive electrode, and then a downwardly ramping voltage to the first conductive electrode, during the plurality of the electrical current pulses.

* * * * *